United States Patent
Sato

(10) Patent No.: US 6,942,737 B2
(45) Date of Patent: Sep. 13, 2005

(54) SUBSTRATE CLEANING APPARATUS AND METHOD

(75) Inventor: Masanobu Sato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 4 days.

(21) Appl. No.: 10/155,643

(22) Filed: May 22, 2002

(65) Prior Publication Data

US 2002/0189641 A1 Dec. 19, 2002

(30) Foreign Application Priority Data

Jun. 18, 2001 (JP) ........................................ 2001-182839

(51) Int. Cl.$^7$ ................................................ B08B 7/00
(52) U.S. Cl. ............................. 134/6; 134/33; 134/902; 15/77; 15/88.3; 15/102
(58) Field of Search ............................. 134/6, 33, 902, 134/32, 77, 88.2, 88.3, 102; 15/77, 88.3, 102, 88.2

(56) References Cited

U.S. PATENT DOCUMENTS

| | | | | |
|---|---|---|---|---|
| 5,725,414 A | * | 3/1998 | Moinpour et al. ............. 454/41 |
| 5,853,522 A | * | 12/1998 | Krusell et al. ......... 156/345.11 |
| 5,868,866 A | * | 2/1999 | Maekawa et al. ............. 134/34 |
| 5,873,380 A | * | 2/1999 | Kanno ..................... 134/102.1 |
| 5,901,399 A | * | 5/1999 | Moinpour et al. ............. 15/77 |
| 5,918,817 A | | 7/1999 | Kanno et al. |
| 5,934,566 A | | 8/1999 | Kanno et al. |
| 5,947,134 A | * | 9/1999 | Kim et al. ................. 134/57 R |
| 5,976,267 A | * | 11/1999 | Culkins et al. ................ 134/6 |
| 6,048,409 A | | 4/2000 | Kanno et al. |
| 6,151,744 A | * | 11/2000 | Ohtani et al. ................. 15/88.2 |
| 6,170,110 B1 | * | 1/2001 | Svirchevski et al. ........... 15/77 |
| 6,260,562 B1 | * | 7/2001 | Morinishi et al. ........ 134/57 R |
| 6,292,972 B1 | * | 9/2001 | Ishihara et al. ................. 15/77 |
| 6,385,805 B2 | * | 5/2002 | Konishi et al. ................. 15/77 |
| 6,647,579 B2 | * | 11/2003 | Manfredi et al. ............... 15/77 |

FOREIGN PATENT DOCUMENTS

JP      2001156032      6/2001

* cited by examiner

*Primary Examiner*—Michael Barr
*Assistant Examiner*—Saeed Chaudhry
(74) *Attorney, Agent, or Firm*—Ostrolenk, Faber, Gerb & Soffen, LLP

(57) ABSTRACT

A substrate is supported at a plurality of edge positions thereof, to be in horizontal posture, by support pins erected on a spin chuck. A two-fluid nozzle is fixed to a position spaced from and directly over edges of the substrate to clean the edges. Substantially simultaneously therewith, a cleaning brush cleans the substrate while swinging over, in direct contact with, areas other than the edges of the substrate. The two-fluid nozzle delivers mist in a small quantity and in minute droplets. The mist is restrained from rebounding and scattering from the plurality of edge positions supported by the support pins of the spin chuck. The mist may be supplied to clean such positions.

13 Claims, 4 Drawing Sheets

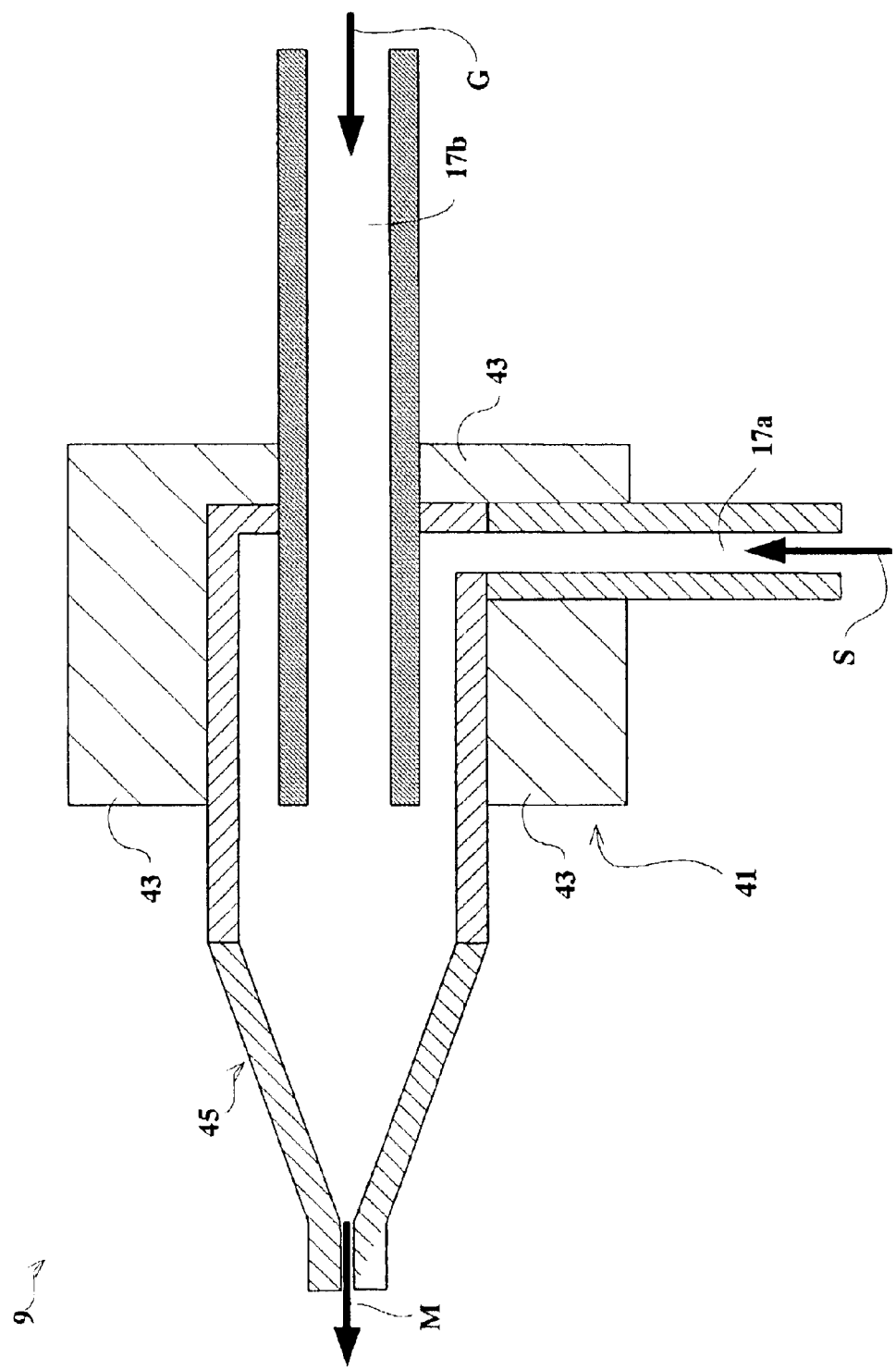

SUBSTRATE CLEANING APPARATUS AND METHOD

BACKGROUND OF THE INVENTION (1) Field of the Invention

The present invention relates to substrate cleaning apparatus and methods for supplying a cleaning solution from a nozzle to and cleaning substrates such as semiconductor wafers, glass substrates for liquid crystal displays, glass substrates for photomasks, substrates for optical disks and the like. More particularly, the invention relates to a technique of performing a cleaning process by using a two-fluid nozzle for forming mist by mixing a cleaning solution and a pressurized gas.

(2) Description of the Related Art

In a conventional substrate cleaning apparatus for cleaning substrates, the substrates are supported by a chuck type device that supports each substrate at edges thereof, for example.

However, in the substrate cleaning apparatus with the chuck type device for supporting a substrate at edges thereof, support pins that support the edges of the substrate are obstructive to a cleaning operation. Consequently, the edges of the substrate cannot be cleaned.

When removing minute particles, a physical cleaning is used. For example, a scrub cleaning is carried out in which a brush or sponge is placed in direct contact with the substrate spinning at high speed. However, such a physical cleaning cannot clean the edges of the substrate since the brush or sponge contacts the support pins.

To solve this problem, the conventional apparatus requires a mechanism for retracting the support pins to realize an unhindered cleaning operation. Alternatively, a separate, dedicated edge cleaning unit must be installed.

In such a case, however, the apparatus has a complicated construction, and the processing time is extended.

SUMMARY OF THE INVENTION

The present invention has been made having regard to the state of the art noted above, and its object is to provide a simple substrate cleaning apparatus and method for cleaning edges of substrates efficiently.

The above object is fulfilled, according to the present invention, by a substrate cleaning apparatus comprising a substrate supporting device for supporting a substrate at a plurality of edge positions thereof to hold the substrate in horizontal posture, a physical contact type cleaning mechanism for cleaning the substrate in direct contact therewith, and a droplet forming device for forming droplets by mixing a cleaning solution and a pressurized gas, and supplying the droplets of the cleaning solution to the substrate, wherein the droplet forming device cleans edges of the substrate.

With the substrate cleaning apparatus according to the invention, the substrate supporting device supports a substrate at a plurality of edge positions thereof to hold the substrate in horizontal posture. The physical contact type cleaning mechanism cleans the substrate in direct contact therewith, while the latter is held in horizontal posture by the substrate supporting device. The droplet forming device supplies and cleans the substrate with the cleaning solution in the form of droplets.

The droplet forming device forms the droplets by mixing the cleaning solution and pressurized gas. Compared with a cleaning solution delivered from a different cleaning mechanism, the droplets of the cleaning solution formed by the droplet forming device is small in quantity and the droplets are minute. Since the edges of the substrate are cleaned by the droplet forming device, the cleaning solution in droplets is restrained from rebounding and scattering from the plurality of edge positions supported by the substrate supporting device. The cleaning solution in droplets may be supplied to clean such positions.

The apparatus may be simplified, without being complicated by an additional mechanism for retracting support pins or a separate, dedicated edge cleaning unit as found in the prior art. Further, the substrate is cleaned by the physical contact type cleaning mechanism also. This reduces the time required for the cleaning process, and allows the edges of the substrate to be cleaned efficiently.

The term "physical contact type cleaning" used herein refers to a physical cleaning for scrub-cleaning the substrate by placing a brush or sponge in direct contact with the substrate spinning at high speed. Thus, one example of the physical contacting type cleaning mechanism is a cleaning brush.

The droplet forming device may be the air blast type or a two-fluid nozzle, for example.

Preferably, the cleaning mechanism cleans the substrate while swinging over areas other than the edges of the substrate. With the cleaning mechanism of this construction, the cleaning mechanism cleans the areas other than the edges of the substrate, while the droplet forming device cleans the edges of the substrate. Preferably, with the areas other than the edges of the substrate being set to an entire surface excluding the edges of the substrate, the entire surface of the substrate is cleaned efficiently.

Where the substrate is cleaned by the droplet forming device and cleaning mechanism, the apparatus must, of course, be controlled to avoid interference between the droplet forming device and cleaning mechanism. Thus, the cleaning mechanism may be controlled to clean the substrate while swinging over the areas other than the edges of the substrate as noted above. The droplet forming device, particularly the two-fluid nozzle, which cleans the edges of the substrate, may be controlled, e.g. fixed as set out hereunder. That is, the two-fluid nozzle is fixedly disposed to supply the cleaning solution misted therein to the edges of the substrate. By simply fixing the two-fluid nozzle as above, interference between the two-fluid nozzle and cleaning mechanism may be avoided.

Preferably, the apparatus further comprises a substrate spinning device for spinning the substrate in a plane. For example, by spinning the substrate at high speed, the cleaning solution remaining on the substrate after a cleaning operation may be scattered, thereby to dry the substrate.

It is preferred that the cleaning solution is ultrapure water with carbon dioxide added thereto. By using ultrapure water with carbon dioxide added thereto as the cleaning solution, a low specific resistance value is secured to suppress static electricity due to a friction between the front surface or back surface of the substrate and the cleaning solution, thereby preventing a dielectric breakdown of the substrate.

A preferred gas used in the droplet forming device is an inert gas. Since the inert gas used causes no chemical reaction with the cleaning solution or substrate, the cleaning solution and substrate are free from an adverse influence.

The invention is not limited to a particular structure or shape of the two-fluid nozzle. Thus, the two-fluid nozzle may include a mixing chamber for forming a misted cleaning solution by mixing the gas and the cleaning solution therein. Alternatively, the two-fluid nozzle may include a gas delivery nozzle for delivering the gas, and a cleaning solution delivery nozzle for delivering the cleaning solution, the gas and the cleaning solution colliding each other outside the two-fluid nozzle to form a misted cleaning solution.

In another aspect of the invention, a substrate cleaning method comprises the steps of supporting a substrate at a plurality of edge positions thereof to hold the substrate in horizontal posture, causing a physical contact type cleaning mechanism for directly contacting the substrate to clean the substrate, and causing a droplet forming device for forming droplets by mixing a cleaning solution and a pressurized gas to supply the droplets of the cleaning solution to the substrate, wherein the droplets of the cleaning solution supplied to the substrate by the droplet forming device clean edges of the substrate.

In the substrate cleaning method according to the invention, the substrate is held in horizontal posture by being supported at a plurality of edge positions. This step is followed by the steps of causing the physical contact type cleaning mechanism for directly contacting the substrate to clean the substrate, and causing the droplet forming device for forming droplets by mixing a cleaning solution and a pressurized gas to supply the droplets of the cleaning solution to the substrate. Thus, the cleaning mechanism cleans the substrate, while the droplet forming device cleans the edges of the substrate. Since the edges of the substrate are cleaned by the droplet forming device in the above series of cleaning processes, the cleaning solution in droplets is restrained from rebounding and scattering from the plurality of edge positions supported by the substrate supporting device. The cleaning solution in droplets may be supplied to clean such positions. As a result, the edges of the substrate may be cleaned efficiently.

Preferably, the substrate is cleaned by the droplet forming device and the cleaning mechanism substantially simultaneously in a series of cleaning processes. The substantially simultaneous cleaning reduces the time required for the cleaning process, and allows the edges of the substrate to be cleaned efficiently.

The substrate may be cleaned while spinning in a plane, thereby to be cleaned uniformly.

The edges of the substrate may be cleaned while the substrate spins in a plane. Then, the entire edges may be cleaned by the droplet forming device while the substrate is spinning.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 3 is a view in vertical section of a two-fluid nozzle;

DESCRIPTION OF THE PREFERRED EMBODIMENTS

A preferred embodiment of the present invention will be described in detail hereinafter with reference to the drawings.

In this embodiment, the physical contact type cleaning mechanism is exemplified by a cleaning brush for cleaning a substrate in direct contact therewith.

Figure 1:
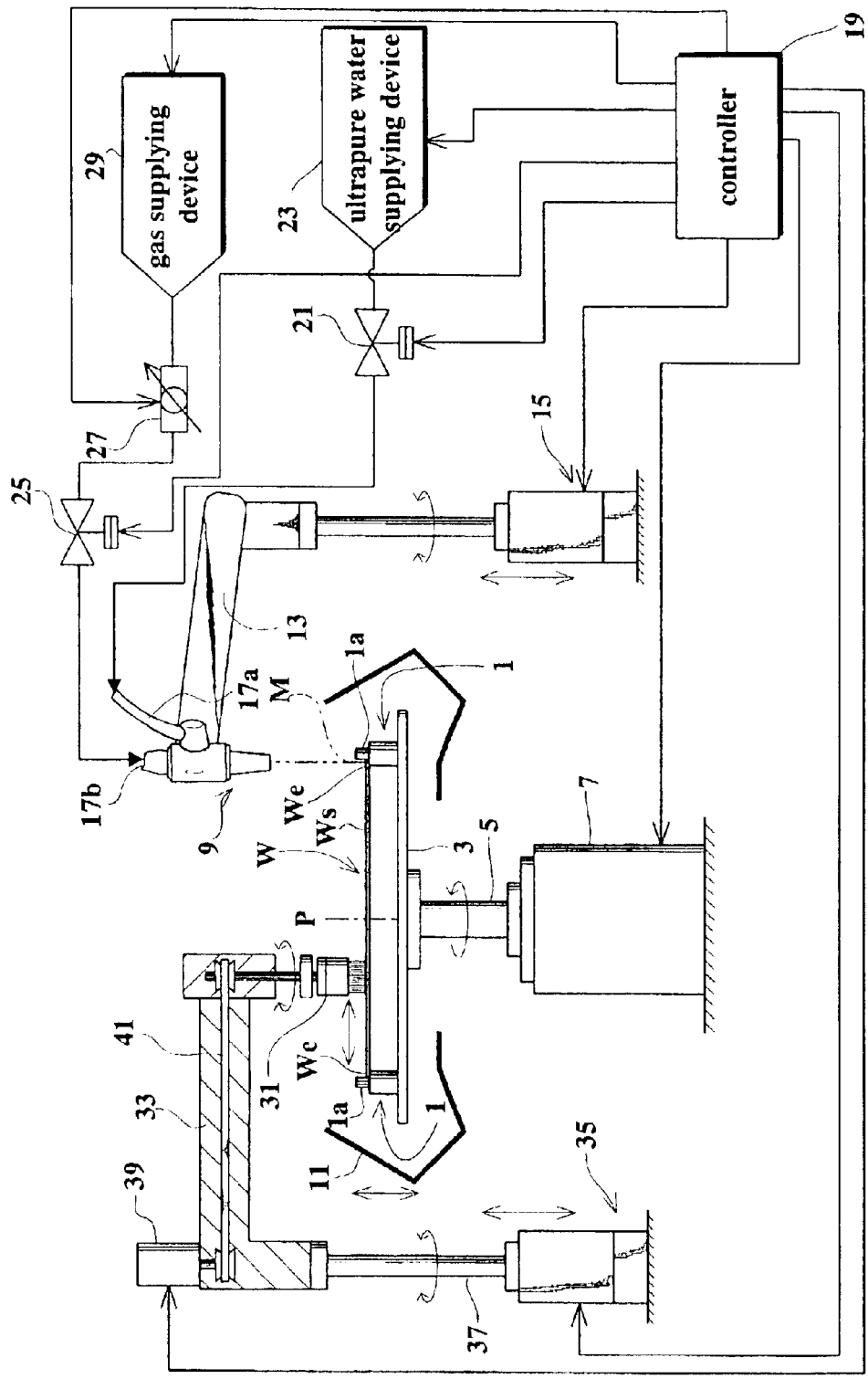
FIG. 1 is a block diagram showing an outline of a substrate cleaning apparatus according to the invention.

Referring to FIG. 1, six cylindrical support pins 1 are erected on a disk-shaped spin chuck 3 driven by an electric motor 7 through a rotary shaft 5 connected to the bottom of the chuck 3. FIG. 1 shows only two support pins 1 to avoid complexity of illustration. With a spinning of the chuck 3, a wafer W contacted and supported at edges We thereof by the support pins 1 spins in a horizontal plane about a spin center P. The spin chuck 3 with the support pins 1 erected thereon, and the rotary shaft 5 and electric motor 7 correspond to the substrate supporting device and the substrate spinning device of the present invention, respectively.

The wafer W is placed on the spin chuck 3 with the front surface Ws of wafer W facing up when the front surface Ws is to be cleaned, and with the back surface facing up when the back surface is to be cleaned. The wafer W so placed is contacted and supported at a plurality of edges We by contact portions 1a of support pins 1. With the six support pins 1 supporting the edges We, the wafer W is held in horizontal posture.

A cleaning nozzle 9 of the two-fluid type (hereinafter called "two-fluid nozzle 9" for short) forms mist M by mixing a pressurized gas G and a cleaning solution S, and discharges the mist M. The spin chuck 3 is surrounded by a scatter preventive cup 11 for prevent scattering of the mist M. The scatter preventive cup 11 is moved up and down relative to the spin chuck 3, as indicated by an arrow in FIG. 1, when the spin chuck 3 receives a wafer W to be cleaned.

As shown in FIG. 1, the two-fluid nozzle 9 is supported by a support arm 13 to have a discharge opening thereof directed perpendicular to the horizontal plane of wafer W. As indicated by an arrow in FIG. 1, the nozzle 9 is vertically movable and horizontally swingable, along with the support arm 13, by a nozzle drive mechanism 15. During a cleaning process, the two-fluid nozzle 9 is fixed directly over the edges We of wafer W to continue supplying the mist M to the edges We.

The two-fluid nozzle 9 has, connected to a cylindrical portion thereof, a supply pipe 17a for supplying the cleaning solution S, and a gas introduction pipe 17b for introducing the pressurized gas G. The supply pipe 17a is connected to an ultrapure water supplying device 23 through a control valve 21 operable by a controller 19. The ultrapure water supplying device 23 supplies the supply pipe 17a with the cleaning solution S in the form of ultrapure water with carbon dioxide ($CO_2$) added thereto. The gas introduction pipe 17b receives the gas G from a gas supplying device 29 connected through a control valve 25 operable by the controller 19 and a pressure regulator 27 operable by the controller 19 to perform pressure regulations such as pressurizing and depressurizing of the gas G.

In this embodiment, ultrapure water with carbon dioxide added thereto is used as the cleaning solution S. However, this is not limitative, but cleaning solutions used in usual substrate cleaning operations may be used here also, which include, for example, acid, alkali, deionized water alone, and ozone water with ozone dissolved in deionized water. In this embodiment, by using ultrapure water with carbon dioxide added thereto as the cleaning solution S, a low specific resistance value is secured to suppress static electricity due to a friction between the front surface Ws or back surface of wafer W and the cleaning solution S, thereby preventing a dielectric breakdown of wafer W.

As the gas G this embodiment uses nitrogen ($N_2$) which is an inert gas. Other inert gases include air and argon (Ar), for example. In this embodiment, since the inert gas used causes no chemical reaction with the cleaning solution S or wafer W, the cleaning solution S and wafer W are free from an adverse influence.

Figure 2:
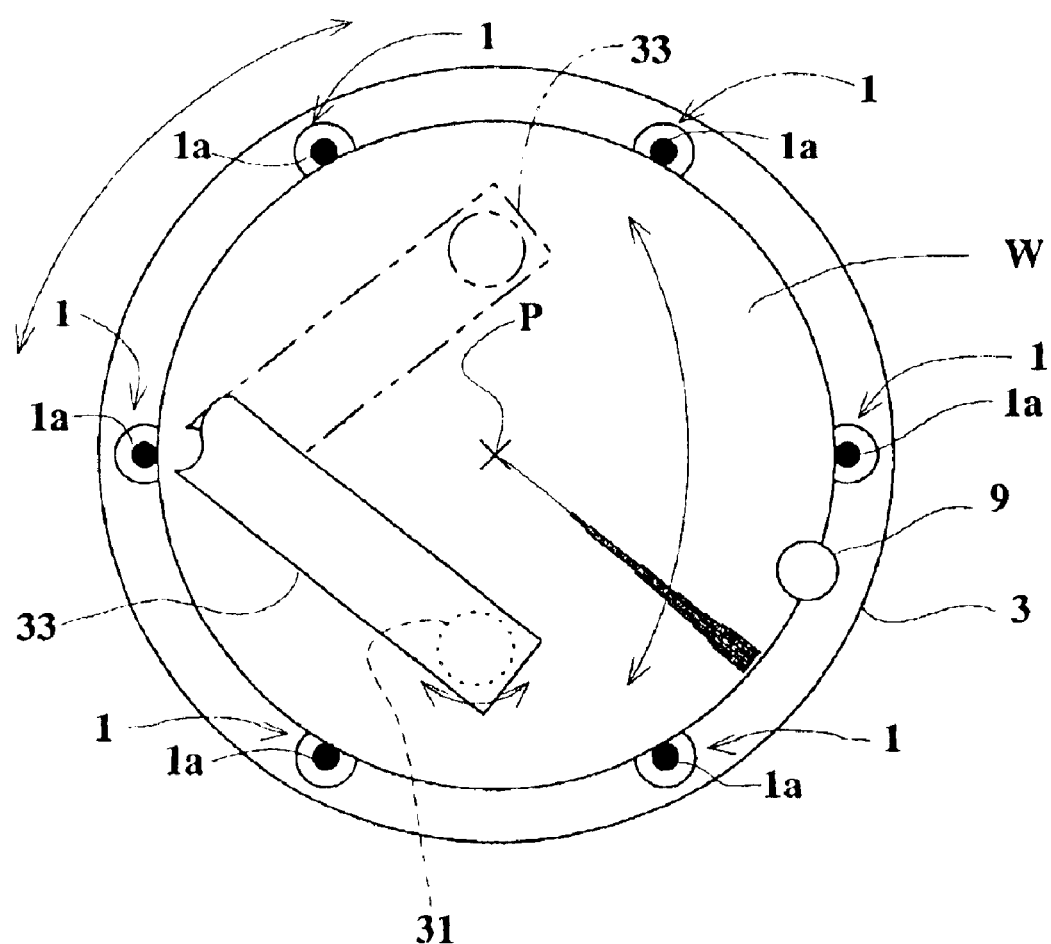
FIG. 2 is a plan view of a spin chuck.

A cleaning brush 31 is supported by a vertically movable and horizontally swingable support arm 33. Thus, the cleaning brush 31, while swinging as indicated by arrows FIGS. 1 and 2, may clean areas other than the edges We of wafer W. This support arm 33 is connected at a bottom thereof to a rotary shaft 37 of a brush drive mechanism 35. The support arm 33 is swingable with rotation of the rotary shaft 37, and vertically movable with vertical movement of the rotary shaft 37. The support arm 33 has a brush rotating mechanism 39 for rotating the cleaning brush 31 about a vertical axis. Rotation of the brush rotating mechanism 39 is transmitted to a shaft of the cleaning brush 31 through a belt 41 mounted in the support arm 33 to rotate the cleaning brush 31 about the vertical axis. The cleaning brush 31 corresponds to the cleaning mechanism of the present invention.

The electric motor 7, nozzle drive mechanism 15, control valves 21 and 25, ultrapure water supplying device 23, brush drive mechanism 35 and brush rotating mechanism 39 are controlled in an integrated way by the controller 19.

The two-fluid nozzle 9 will be described next with reference to FIG. 3. The two-fluid nozzle 9 has a mixing portion 41 of double pipe structure in which a support member 43 supports the supply pipe 17a surrounding the gas introduction pipe 17b. That is, the gas introduction pipe 17b is inserted into the supply pipe 17a. Further, the two-fluid nozzle 9 has a tip portion 45 with a tapered pipe formed integral with a straight cylindrical pipe for accelerating mist M. The supply pipe 17a and gas introduction pipe 17b are not limited to a particular shape, but may be a curved pipe or square pipe. Preferably, each pipe, and particularly the gas introduction pipe 17b, is in the form of a straight cylindrical pipe from the point of view of suppressing a generation of particles inside the two-fluid nozzle 9.

Operation of the substrate cleaning apparatus having the above construction will be described next. First, the scatter preventive cup 11 is lowered relative to the spin chuck 3, and a wafer W is placed on the spin chuck 3. Then, the scatter preventive cup 11 is raised. The two-fluid nozzle 9 is fixed to a position directly over an edge We of wafer W. The cleaning brush 31 is moved to a position over an area other than the edges We of wafer W, and lowered into contact with the wafer W.

Next, the two-fluid nozzle 9 delivers the mist M to strike against the wafer W spinning at a fixed low speed. In this way, the two-fluid nozzle 9 cleans the wafer W. On the other hand, the cleaning brush 31 cleans the wafer W substantially simultaneously with the cleaning of the wafer W by the two-fluid nozzle 9. This is done by swinging the support arm 33 supporting the cleaning brush 31 as indicated by the arrow in FIG. 2, while rotating the cleaning brush 31 about the vertical axis. With the swinging of support arm 33, the cleaning brush 31 also swings to clean the areas other than the edges We of wafer W.

After the above cleaning treatment is performed for a fixed time, the delivery of mist M is stopped and the two-fluid nozzle 9 moved to a standby position. The cleaning brush 31 also is moved to a standby position. At the same time, the wafer W is spun at high speed to scatter away the cleaning solution S supplied. In this way, the wafer W is spin-dried to complete the series of cleaning processes.

The above functions produce the following effects. Inside the two-fluid nozzle 9, the cleaning solution S and pressurized gas G are mixed in the mixing portion 41 to form a misted cleaning solution (mist M). Compared with a cleaning solution delivered from a different cleaning mechanism, the mist M delivered from the two-fluid nozzle 9 is small in quantity and its droplets are minute. Since the edges We of wafer W are cleaned by the two-fluid nozzle 9, the mist M is restrained from rebounding and scattering from the plurality of edge positions supported by the support pins 1 of the spin chuck 3. The mist M may be supplied to clean such positions. The apparatus may be simplified, without being complicated by an additional mechanism for retracting the support pins 1 or a separate, dedicated edge cleaning unit as found in the prior art.

Further, substantially simultaneously with the cleaning of the edges We of wafer W by the two-fluid nozzle 9, the cleaning brush 31 cleans the other areas of wafer W. This reduces the time required for the cleaning process, and allows the edges We of wafer W to be cleaned efficiently.

Since the cleaning brush 31 is swung over the areas other than the edges We of wafer W while the two-fluid nozzle 9 is fixed, no interference occurs between the two-fluid nozzle 9 and cleaning brush 31. Further, the two-fluid nozzle 9 is fixed to a position directly over or outwardly of the edges We of wafer W to ensure the avoidance of interference.

Since the wafer W is spun in a plane by rotation of the rotary shaft 5 driven by the electric motor 7, the wafer W may be dried by spinning the wafer W at high speed to scatter the cleaning solution S to the ambient. The cleaning brush 31, while being swung over the wafer W spinning in the plane, may clean the areas other than edges We of wafer W. As a result, the entire surface excluding the edges We of wafer W may be cleaned uniformly only by swinging the cleaning brush 31 to reciprocate diametrically of the wafer W. The two-fluid nozzle 9 can clean all the edges of the wafer W in a spin.

The present invention is not limited to the above embodiment, but may be modified as follows:

(1) In the above embodiment, the substrate supporting device of the invention is exemplified by the chuck type device such as the spin chuck 3 with support pins 1 erected thereon. The substrate supporting device is not limited to any particular type as long as the substrate is supported at a plurality of edge positions to be in horizontal posture.

Figure 4A:
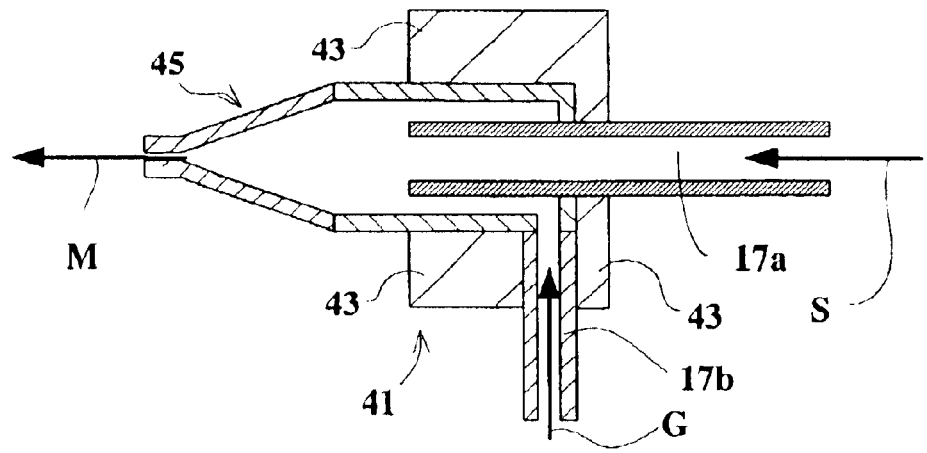
FIG. 4A is a view showing a modified two-fluid nozzle.

(2) In the above embodiment, the two-fluid nozzle 9 has a structure in which the supply pipe 17a surrounds the gas introduction pipe 17b (see FIG. 3). This structure may be modified, as shown in FIG. 4A, in which the gas introduction pipe 17b surrounds the supply pipe 17a.

Figure 4B:
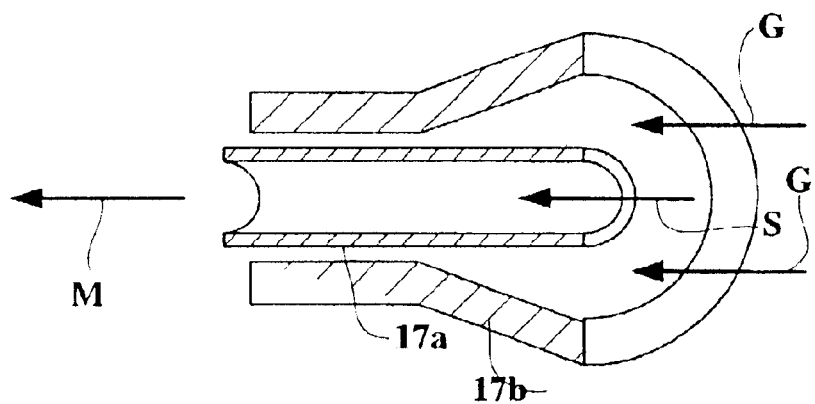
FIG. 4B is a view showing another modified two-fluid nozzle.
Figure 4C:
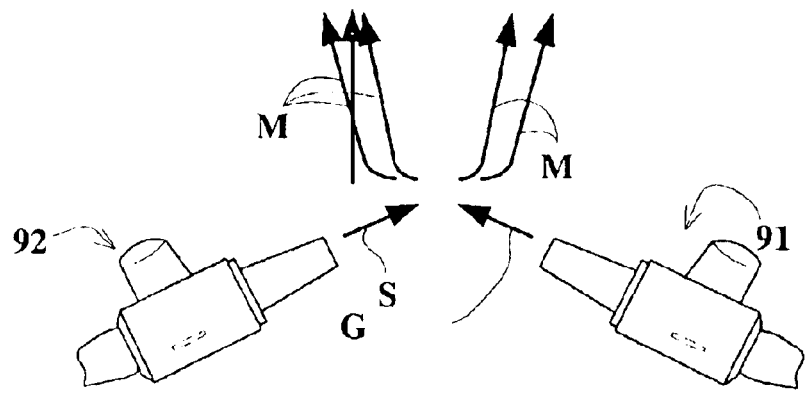
FIG. 4C is a view showing a further modified two-fluid nozzle.

In the described embodiment, the two-fluid nozzle is what is known as the internal mixing type for mixing the cleaning solution S and gas G in the mixing portion 41 formed in the nozzle (see FIG. 3). The nozzle may be the external mixing type for forming mist by mixing the cleaning solution and gas adjacent the discharge opening of the nozzle or outside the nozzle. As shown in FIG. 4B, for example, a supply pipe 17a and a gas introduction pipe 17b have discharge openings, respectively, and mist M may be formed by mixing, adjacent the discharge openings, the cleaning solution S and gas G delivered from the discharge openings. As shown in FIG. 4C, a gas delivery nozzle 91 and a cleaning solution delivery nozzle 92 are provided such that the gas G and cleaning solution S delivered from the nozzles 91 and 92 collide with each other outside the nozzles to form mist M. Thus, the invention is not limited to a particular structure or shape of the two-fluid nozzle.

(3) In the cleaning process in the foregoing embodiment, the cleaning brush 31 is swung over the areas other than the edges We of wafer W while the wafer W spun in a horizontal plane by the electric motor 7. The substrate spinning device of the invention (e.g. the rotary shaft 5 and electric motor 7 in the described embodiment) may be omitted as long as the entire surface of wafer W is cleaned only by swinging the cleaning brush 31 or where there is no need to clean the entire surface of wafer W.

However, the substrate spinning device should, preferably, be provided to clean the wafer efficiently or to dry the wafer by scattering the cleaning solution through a high-speed spin within a cleaning unit.

(4) While the above embodiment shows one two-fluid nozzle, two or more such nozzles may be used. For example, two two-fluid nozzles may be arranged opposite each other across the spin center P of wafer W spinning in a plane. Then, the processing time may be reduced to approximately a half, or the cleaning efficiency may be approximately doubled.

(5) In the above embodiment, the cleaning mechanism of the invention is exemplified by the cleaning brush. The cleaning mechanism is not limited to any particular type, and may be adapted to perform a scrub cleaning not using a brush, as long as this is a physical contact type cleaning (physical cleaning) such as by using a sponge placed in direct contact with the wafer.

(6) In the above embodiment, the two-fluid nozzle 9 is fixed while the cleaning brush 31 is swung to clean the areas other than the edges of the wafer. To clean the edges with increased effect, the two-fluid nozzle 9 may also be swung, for example. The invention is not limited to a particular cleaning track followed by the two-fluid nozzle 9 or cleaning brush 31 as long as an interference therebetween is avoided.

In the above embodiment, the cleaning nozzle 9 is directed perpendicular to the horizontal plane of wafer W. Instead, the nozzle 9 may be disposed at an angle to the horizontal plane.

(7) In the above embodiment, the two-fluid nozzle and cleaning brush clean the wafer substantially simultaneously. For example, the cleaning brush may first clean the areas other than the edges, the two-fluid nozzle cleaning the edges next. The invention is not limited to a particular order of cleaning processes. However, the two cleaning processes should preferably be performed substantially simultaneously for efficiency.

(8) In the above embodiment, the two-fluid nozzle is used as the droplet forming device for forming droplets by mixing the cleaning solution and pressurized gas, and supplying the droplets of the cleaning solution to the wafer. The invention is not limited to such, but may employ the air blast type, for example.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate cleaning apparatus comprising:
   substrate support means for supporting a substrate at a plurality of edge positions thereof to hold said substrate in horizontal posture;
   substrate spinning means for spinning the substrate by spinning said substrate support means;
   a cleaning mechanism including a physical contact type brush for cleaning said substrate in direct contact therewith, and a support arm for swinging said brush to clean areas other than edges of said substrate; and
   droplet forming means for forming droplets by mixing a cleaning solution and a pressurized gas, and supplying said droplets of said cleaning solution to said substrate;
   wherein said droplet forming means cleans, with a single two-fluid nozzle disposed directly over edges of said substrate, edges of said substrate spinning as supported at the edge positions by said substrate support means, said droplet forming means comprising said two-fluid nozzle; and
   said apparatus being operable so that said substrate is cleaned by said droplet forming means and said cleaning mechanism substantially simultaneously for a fixed time, thereby effecting complete cleaning of an entire surface including the edges of the substrate, in a series of cleaning processes.

2. A substrate cleaning apparatus as defined in claim 1, wherein said cleaning mechanism is a cleaning brush.

3. A substrate cleaning apparatus as defined in claim 1, wherein said cleaning mechanism cleans said substrate while swinging over areas other than the edges of said substrate.

4. A substrate cleaning apparatus as defined in claim 3, wherein, with said areas other than the edges of said substrate being set to an entire surface excluding the edges of said substrate, said droplet forming means and said cleaning mechanism clean the entire surface of said substrate.

5. A substrate cleaning apparatus as defined in claim 1, further comprising substrate spinning means for spinning said substrate in a plane.

6. A substrate cleaning apparatus as defined in claim 1, wherein said cleaning solution is ultrapure water with carbon dioxide added thereto.

7. A substrate cleaning apparatus as defined in claim 1, wherein said gas is an inert gas.

8. A substrate cleaning apparatus as defined in claim 1, wherein said two-fluid nozzle includes a mixing chamber for forming a misted cleaning solution by mixing said gas and said cleaning solution therein, and a discharge opening for discharging the misted cleaning solution formed in said mixing chamber.

9. A substrate cleaning apparatus as defined in claim 1, wherein said two-fluid nozzle includes a gas delivery nozzle for delivering the gas, and a cleaning solution delivery nozzle for delivering the cleaning solution, said gas and said cleaning solution colliding each other outside said two-fluid nozzle to form a misted cleaning solution.

10. A substrate cleaning method comprising the steps of:
   supporting a substrate at a plurality of edge positions thereof to hold said substrate in horizontal posture;
   spinning said substrate supported at the edge positions thereof;
   causing a cleaning mechanism including a physical contact type brush for cleaning said substrate in direct contact therewith, and a support arm for swinging said brush to clean areas other than edges of said substrate; and
   causing droplet forming means for forming droplets by mixing a cleaning solution and a pressurized gas to supply said droplets of said cleaning solution to said substrate;
   wherein the step of supplying said droplets of said cleaning solution to said substrate cleans, with a single two-fluid nozzle disposed directly over the edges of said substrate, the edges of said substrate spinning as supported at the edge positions by said substrate support means, said droplet forming means comprising said two-fluid nozzle, said droplet forming means and said cleaning mechanism being operable to substantially simultaneously run for a fixed time to complete cleaning of an entire surface including the edges of the substrate, in a series of cleaning processes.

11. A substrate cleaning method as defined in claim 10, further comprising a step of moving said droplet forming means to a standby position after cleaning the edges of said substrate.

12. A substrate cleaning method as defined in claim 10, wherein said substrate is cleaned while spinning in a plane.

13. A substrate cleaning method as defined in claim 10, wherein the edges of said substrate are cleaned while said substrate spins in a plane.

* * * * *